(12) United States Patent
Sim et al.

(10) Patent No.: US 7,611,948 B2
(45) Date of Patent: Nov. 3, 2009

(54) METHODS OF FORMING NON-VOLATILE MEMORY DEVICE

(75) Inventors: Jae-Hwang Sim, Seoul (KR); Yong-Sik Yim, Seongnam-si (KR); Ki-Nam Kim, Seoul (KR); Jae-Kwan Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 23 days.

(21) Appl. No.: 11/945,477

(22) Filed: Nov. 27, 2007

(65) Prior Publication Data

US 2008/0160693 A1    Jul. 3, 2008

(30) Foreign Application Priority Data

Dec. 28, 2006    (KR) ............... 10-2006-0136711

(51) Int. Cl.
*H01L 21/8247* (2006.01)
*H01L 21/8222* (2006.01)

(52) U.S. Cl. ............... 438/266; 438/6; 438/311; 438/954; 438/FOR. 109; 438/FOR. 386; 438/FOR. 388; 438/258

(58) Field of Classification Search ............... None
See application file for complete search history.

(56) References Cited

U.S. PATENT DOCUMENTS 6,191,975 B1    2/2001    Shimizu et al.

| | | |
|---|---|---|
| 2003/0127682 A1 | 7/2003 | Lee et al. |
| 2007/0034938 A1* | 2/2007 | Kang et al. ............ 257/316 |
| 2007/0077524 A1* | 4/2007 | Koh et al. ............ 430/314 |

FOREIGN PATENT DOCUMENTS

| | | |
|---|---|---|
| JP | 2000-188384 A | 7/2000 |
| JP | 2003-51557 A | 2/2003 |
| KR | 10-0190021 B1 | 1/1999 |
| KR | 2003-0060313 A | 7/2003 |
| KR | 10-2004-0022996 A | 3/2004 |
| KR | 10-0486309 B1 | 3/2005 |
| KR | 10-2005-0101869 A | 10/2005 |
| KR | 10-2006-0068908 A | 6/2006 |
| KR | 10-2006-0093160 A | 8/2006 |
| KR | 10-00655277 B1 | 12/2006 |
| KR | 10-0723769 B1 | 5/2007 |

OTHER PUBLICATIONS

Pavan et al., Proceedings of the IEEE, vol. 85, No. 8, Aug. 1997.*

* cited by examiner

*Primary Examiner*—N Drew Richards
*Assistant Examiner*—Sergey Alekseyev
(74) *Attorney, Agent, or Firm*—Myers Bigel Sibley & Sajovec, P.A.

(57) ABSTRACT

A method of forming a non-volatile memory device includes forming first mask patterns, which can have relatively large distances therebetween. A distance regulating layer is formed that conformally covers the first mask patterns. Second mask patterns are formed in grooves on the distance regulating layer between the first mask patterns.

15 Claims, 22 Drawing Sheets

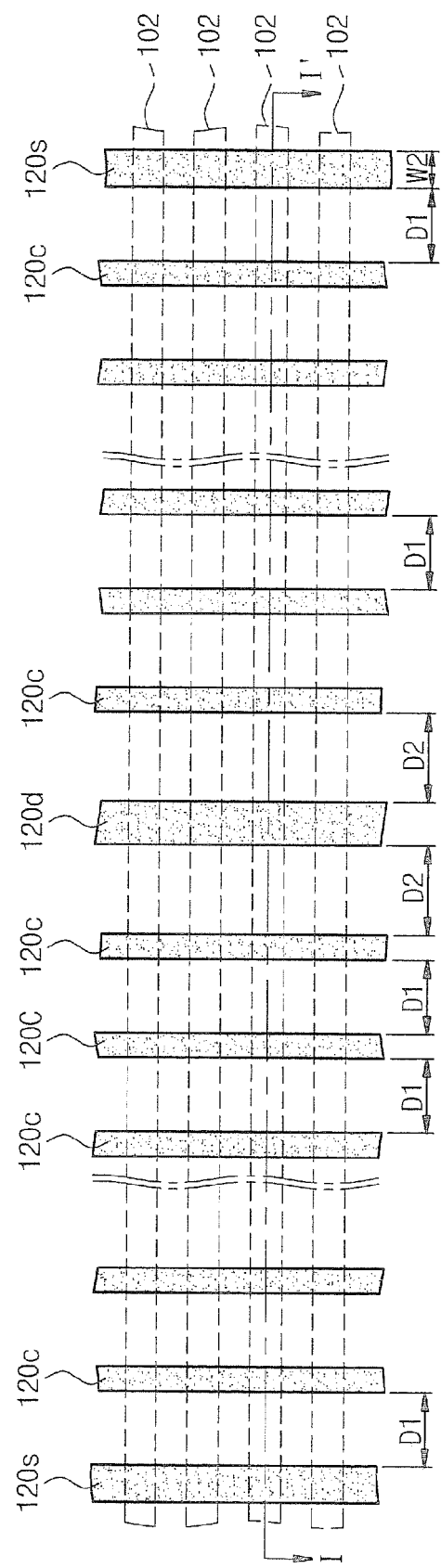

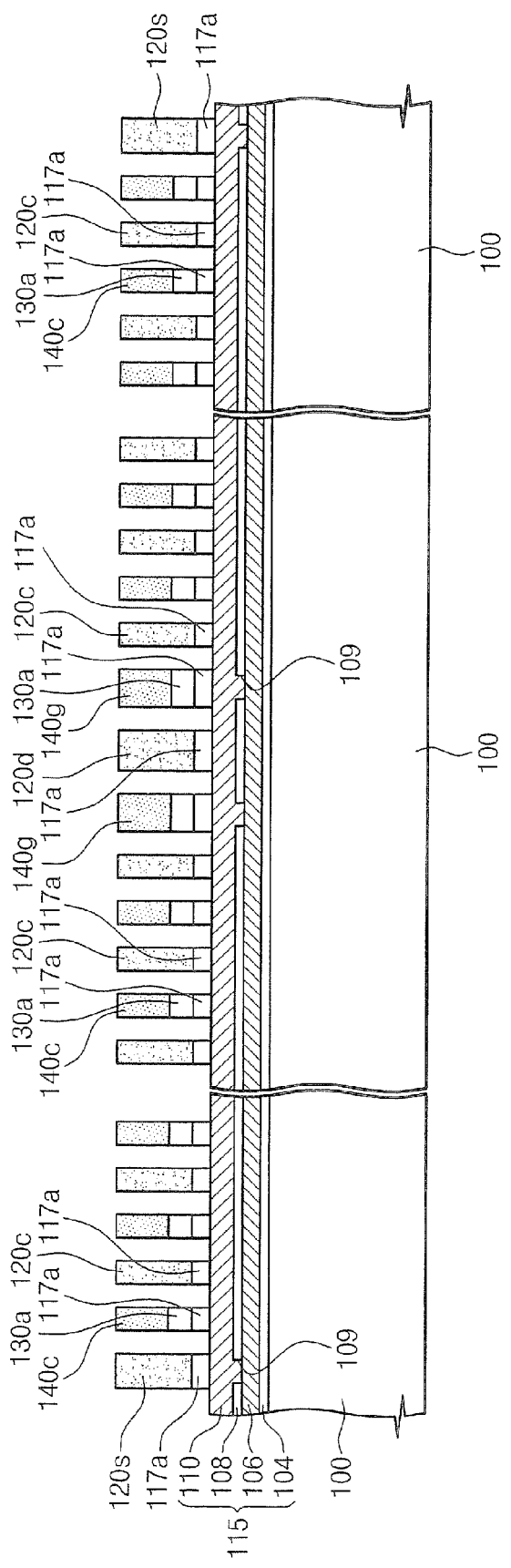

METHODS OF FORMING NON-VOLATILE MEMORY DEVICE

CROSS-REFERENCE TO RELATED APPLICATIONS

This U.S non-provisional patent application claims priority under 35 U.S.C § 119 of Korean Patent Application 10-2006-0136711 filed on Dec. 28, 2006, the entirety of which is hereby incorporated by reference.

BACKGROUND

The present invention relates to methods of forming semiconductor devices and, more specifically, to methods of forming a non-volatile memory device.

Non-volatile memory devices retain their stored data even when their power supplies are interrupted. NAND flash memory devices, which are a kind of non-volatile memory devices, are widely used as mass storage media due to their advantage in high integration density. In recent years, patterns become much finer as the design rule is scaled down to achieve high integration density. One approach to obtaining finer patterns is to develop higher-performance exposure apparatus. However, development and replacement of an exposure apparatus can require an enormous cost, and it is can be difficult to develop/obtain a sufficiently stable light source and exposure technology. As a result, some approaches to the fabrication of semiconductor memory devices have reached a limit on integration density.

FIG. 1 is a top plan view of a conventional NAND flash memory device.

As illustrated in FIG. 1, a plurality of active regions 1 are arranged on a semiconductor substrate in one direction. A ground select gate line 2a and a string select gate line 2b cross over the plurality of active regions 1. A plurality of cell gate lines 3, 3a, and 3b cross over the plurality of active regions 1 between the ground select gate line 2a and the string select gate line 2b. Among the cell gate lines 3, 3a, and 3b, a cell gate line 3a adjacent to the ground select gate line 2a is defined as a first outer cell gate line 3a, and a cell gate line 3b adjacent to the string select gate line 2b is defined as a second outer cell gate line 3a.

It is desirable to have excellent punchthrough characteristics for a ground select transistor including the ground select gate line 2a and a string select transistor including the string select gate line 2b. Accordingly, linewidths of the ground select and string select gate lines 2a and 2b are larger than those of the cell gate lines 3, 3a, and 3b. Increase of spaces at opposite sides adjacent to the ground select and string select gate lines 2a and 2b may be required to define the ground select and string select gate lines 2a and 2b having a relatively larger linewidth by means of an exposure process. Thus, a distance 4 between the ground select gate line 2a and the first outer cell gate line 3a is larger than a distance 5 between a pair of adjacent cell gate lines 3 and 3a or 3b. Similarly, a distance between the string select gate line 2b and the second outer cell gate line 3b is larger than the distance 5.

Accordingly, different spacing distances are provided on opposite sides of the first outer cell gate line 3a and adjacent other lines, and different spacing distances are provided on opposite sides of the second outer cell gate line 3b and adjacent other lines. Consequently, a first outer cell transistor including the first outer cell gate line 3a and the second outer cell transistor including the second outer cell gate line 3b have different characteristics from a cell transistor including another cell gate line 3. Characteristics of cells in such a conventional NAND flash memory device will now be described below with reference to FIG. 2.

FIG. 2 is a graph illustrating characteristics of cells in a conventional NAND flash memory device. In the graph of FIG. 2, the x-axis represents an erase threshold voltage and the y-axis represents positions of a cell transistor disposed between a ground select transistor and a string select transistor. A reference numeral "7a" denotes an erase threshold voltage 7a of a first outer cell transistor including a first outer cell gate line 3a, and a reference numeral "7b" denotes an erase threshold voltage 7b of a second outer cell transistor including a second outer cell gate line 3b.

Referring to FIGS. 1 and 2, erase threshold voltages 7a and 7b of first and second outer cell transistors depart from (are different than) the illustrated trend of erase threshold voltages of another cell transistor disposed therebetween. As a result, the erase/program operation for the first and second outer cell transistors may become slower/faster than that for the above another cell transistor. For these reasons, cell characteristic dispersion of a NAND flash memory device increases due to unexpected characteristics of the first and second outer cell transistors, and the reliability margin of the NAND flash memory device may be reduced.

Because the distance 4 is lengthened, it may be difficult to achieve a high integration density of the NAND flash memory device and the resulting chip size of the NAND flash memory device may be increased.

SUMMARY OF THE INVENTION

Some exemplary embodiments of the present invention are directed to method of forming a non-volatile memory device. In an exemplary embodiment, the method may include: forming first mask patterns on an etching target layer that is on a substrate, the first mask patterns including a source mask line, a string select mask line, and a plurality of first cell mask lines disposed between the source mask line and the string select mask line; forming a distance regulating layer that conformally covers the first mask patterns and defines grooves thereon that are between and extend parallel to adjacent pairs of the first mask patterns; forming second mask patterns in the grooves between the first mask patterns, the second mask patterns including a ground select mask line in a groove adjacent to the source mask line and a plurality of second cell mask lines each in one of the grooves between the first cell mask lines; anisotropically etching the distance regulating layer on both sides of the ground select mask line, the string select mask line, the first cell mask lines, and the second cell mask lines to expose portions of the etching target layer; and patterning the etching target layer using the ground select mask line, the string select mask line, the first cell mask lines, and the second cell mask lines as etch masks to form a ground select gate line, a string select gate line, and a plurality of cell gate lines, respectively.

BRIEF DESCRIPTION OF THE DRAWINGS

FIGS. 3A through 8A are top plan views illustrating methods of forming a non-volatile memory device according to some embodiments of the present invention.

FIGS. 3B through 8B are cross-sectional views taken along lines I-I' of FIGS. 3A through 8A, respectively.

FIGS. 9A through 12A are top plan views illustrating methods of forming a non-volatile memory device according to some other embodiments of the present invention.

FIGS. 9B through 12B are cross-sectional views taken along lines II-II' of FIGS. 9A through 12A, respectively.

DETAILED DESCRIPTION OF PREFERRED EMBODIMENTS

Figure 1:
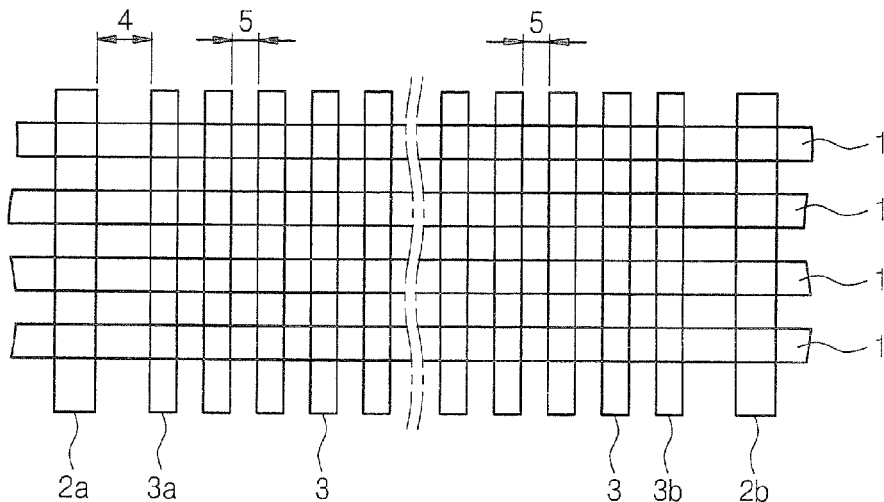
FIG. 1 is a top plan view of a conventional NAND flash memory device.
Figure 2:
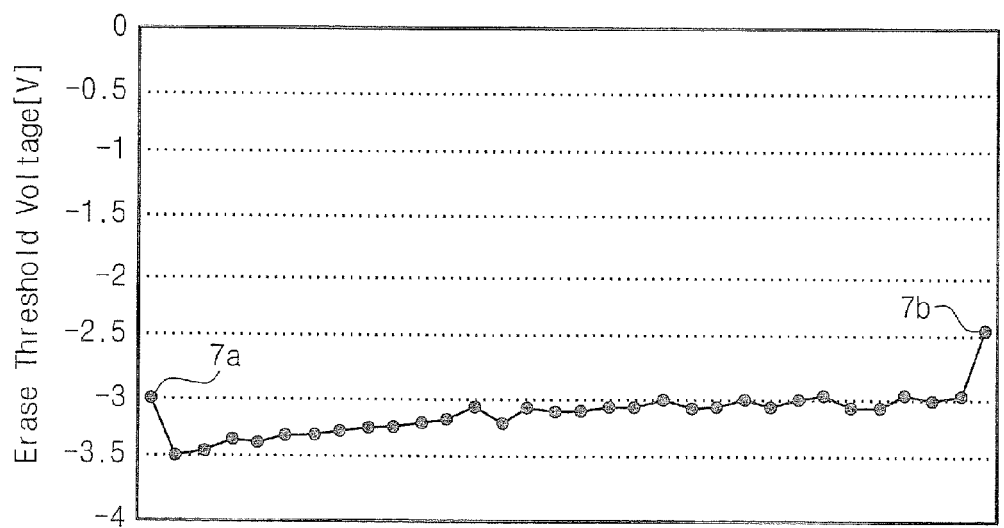
FIG. 2 is a graph illustrating characteristics of cells in a conventional NAND flash memory device.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a film, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, film or region to another element, film or region as illustrated in the figures. It will be understood that these terms are intended to encompass different orientations of the device in addition to the orientation depicted in the figures. Embodiments of the invention are described herein with reference to cross-section illustrations that are schematic illustrations of idealized embodiments (and intermediate structures) of the invention. The thickness of films and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

FIGS. 3A through 8A are top plan views illustrating methods of forming a non-volatile memory device according to some embodiments of the present invention. FIGS. 3B through 8B are cross-sectional views taken along lines I-I' of FIGS. 3A through 8A, respectively.

Figure 3B:
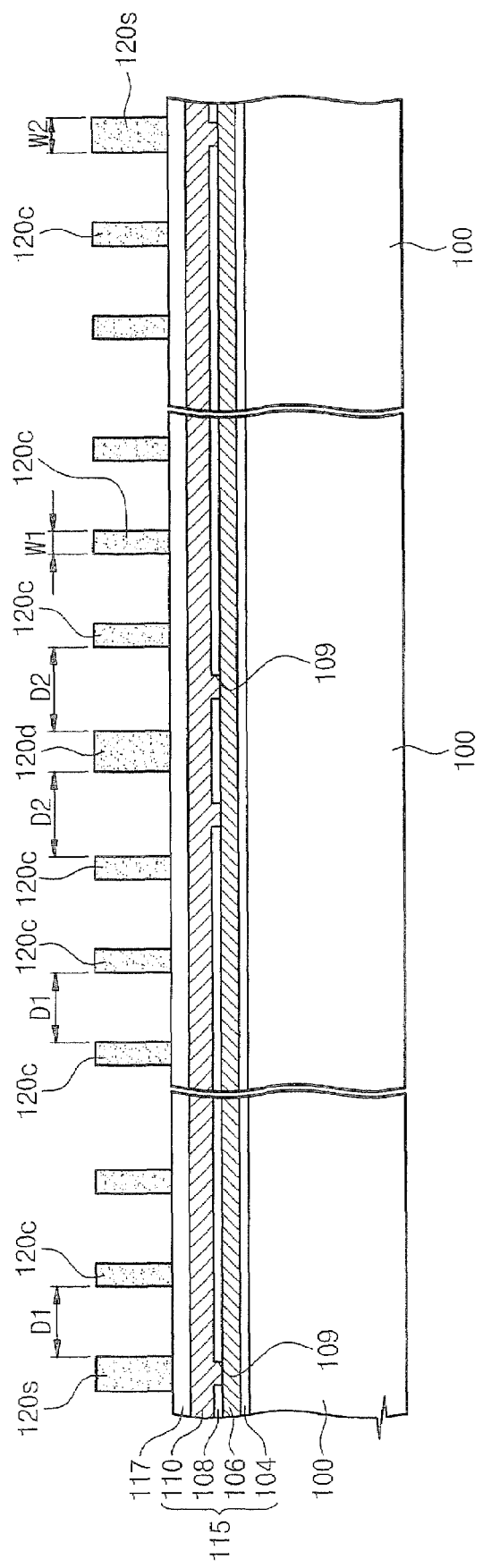

Referring to FIGS. 3A and 3B, a device isolation layer is formed on a semiconductor substrate 100 (hereinafter referred to as "substrate") to define active regions 102. The active regions 102 extend in first direction and run parallel with each other and its are spaced apart from each other. The active regions 102 are defined by portions of the substrate 100 surrounded by the device isolation layer.

An etching target layer 115 is formed on the substrate 100 including the active regions 102. The etching target layer 115 may include a tunnel insulator 104, a charge storage layer 106, a blocking insulating layer 108, and a control gate conductive layer 110, which are sequentially stacked on the substrate 100. The tunnel insulator 104 and the charge storage layer 106 may be sequentially stacked on the active region 102. For example, the charge storage layer 106 may exhibit the shape of a line covering the active region 102. The tunnel insulator 104 may include an oxide, such as, thermal oxide. The charge storage layer 106 may include doped polysilicon or undoped polysilicon. Alternatively, the charge storage layer 106 may include an insulating material (e.g., silicon nitride, etc.) having deep level traps. When the charge storage layer 106 is formed from polysilicon, it may be formed to cover the entire surface of the active region 102.

In contrast, when the charge storage layer 106 includes an insulating material having deep level traps, it may be formed to cover a portion of the active region 102. An active region 102 that the charge storage layer 106 covers may be a region where cell gate lines will be formed in a subsequent process, and an active region 102 that the charge storage layer 106 does not cover may be a region where ground select and string select lines will be formed in a subsequent process.

For purposes of non-limiting explanation only, various embodiments of the present invention are described in the context of where the charge storage layer 106 is formed from doped polysilicon.

Holes 109 are formed to penetrate the blocking insulating layer 108. The holes 109 are formed at regions where a ground select line and a string select gate line will be formed in subsequent processes. Thus, the control gate conductive layer 110 is connected to the charge storage layer 106 via the holes 109.

The blocking insulating layer 108 may include an oxide which is thicker than the tunnel insulator 104. Alternatively, the blocking insulating layer 108 may include oxide-nitride-oxide (ONO). Alternatively, the blocking insulating layer 108 may include a high-k dielectric material having a higher dielectric constant than the tunnel insulator 104. The control gate conductive layer 110 may include at least one selected from the group consisting of doped polysilicon, metal (e.g., tungsten, molybdenum, etc.), metal silicide (e.g., tungsten silicide, titanium silicide, etc.), and conductive metal nitride (e.g., titanium nitride, tantalum nitride, etc.).

A capping insulating layer 117 may be formed on the etching target layer 115. The capping insulating layer 117 may include an insulating material having an etch selectivity with respect to the control gate conductive layer 110. The capping insulating layer 117 may include at least one selected from the group consisting of, for example, oxide, nitride, and oxynitride. Alternatively, the capping insulating layer 117 may be omitted.

A first mask layer is formed on the capping insulating layer 117. The first mask layer is patterned to form first mask patterns. The first mask patterns are spaced apart and extend parallel to one another in a second direction which is perpendicular to the first direction. The first mask patterns include a source mask line 120d and a string select mask line 120s, which are spaced apart and extend parallel to one another on the capping insulating layer 117. Further, the first mask patterns include a plurality of first cell mask lines 120c that are spaced apart and extend parallel to one another on the capping insulating layer 117 between the source mask line 120d and the string select mask line 120s. The first mask patterns are symmetrical with respect to the source mask line 120d. The source mask line 120d is formed within a region where a common source lines will be formed in a subsequent process.

Each of the first cell mask line 120c has a first width W1, and the string select mask line 120s has a second width W2. The second width W2 may be larger than the first width W1. Adjacent ones of the first cell mask lines 120c are spaced apart from each other by a first distance D1. The string select mask line 120s and an adjacent first cell mask line 120c are also spaced apart from each other by the first distance D1. In other words, the plurality of first cell mask lines 120c and the plurality of string select mask lines 120s are equivalently spaced apart by the first distance D1. The source mask line 120d and an adjacent first cell mask line 120c are spaced apart from each other by a second distance D2. The first distance D1 is larger than the first width W1 of the first cell mask line 120c. The first distance D1 may be at least three times larger than the first width W1 of the first cell mask line 120c. For example, the first distance D1 may be three times larger than the first width W1 of the first cell mask line 120c. The second distance D2 is larger than the first distance D1.

The first mask patterns 120d, 120c, and 120s are made of a material having an etch selectivity with respect to the capping insulating layer 117 and to at least upper portion (e.g., the control gate conductive layer 110) of the etching target layer 115. The first mask patterns 120d, 120c, and 120s may be made of, for example, polysilicon, oxide, nitride or oxynitride.

Figure 4A:
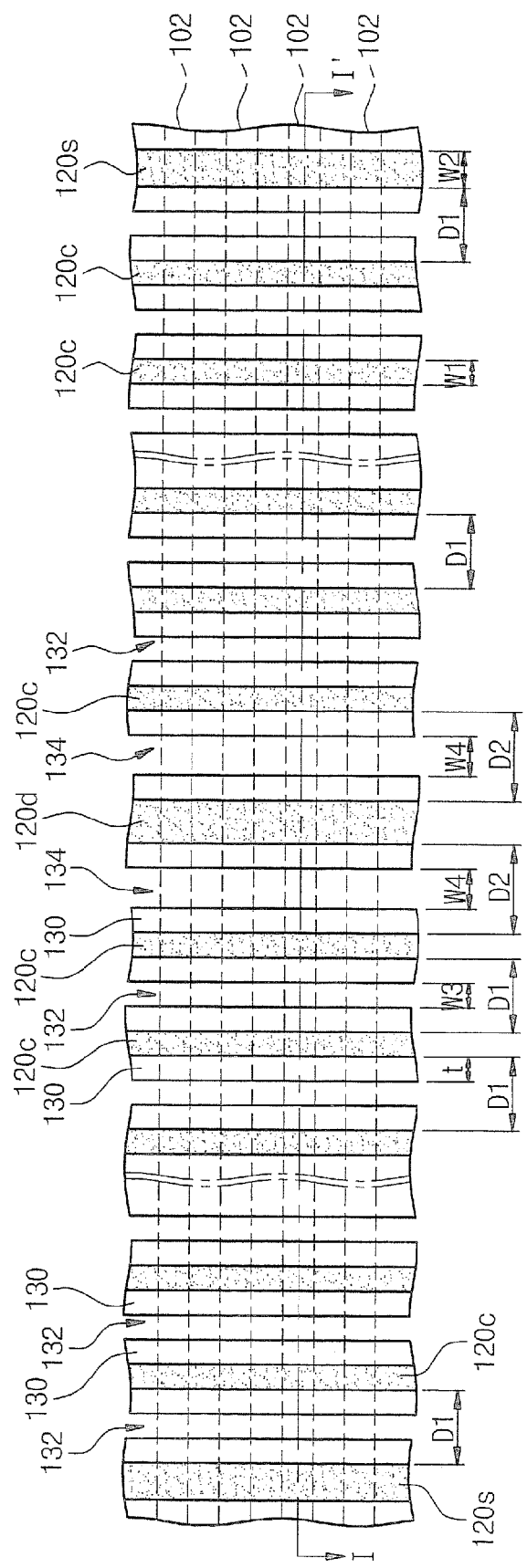
Figure 4B:
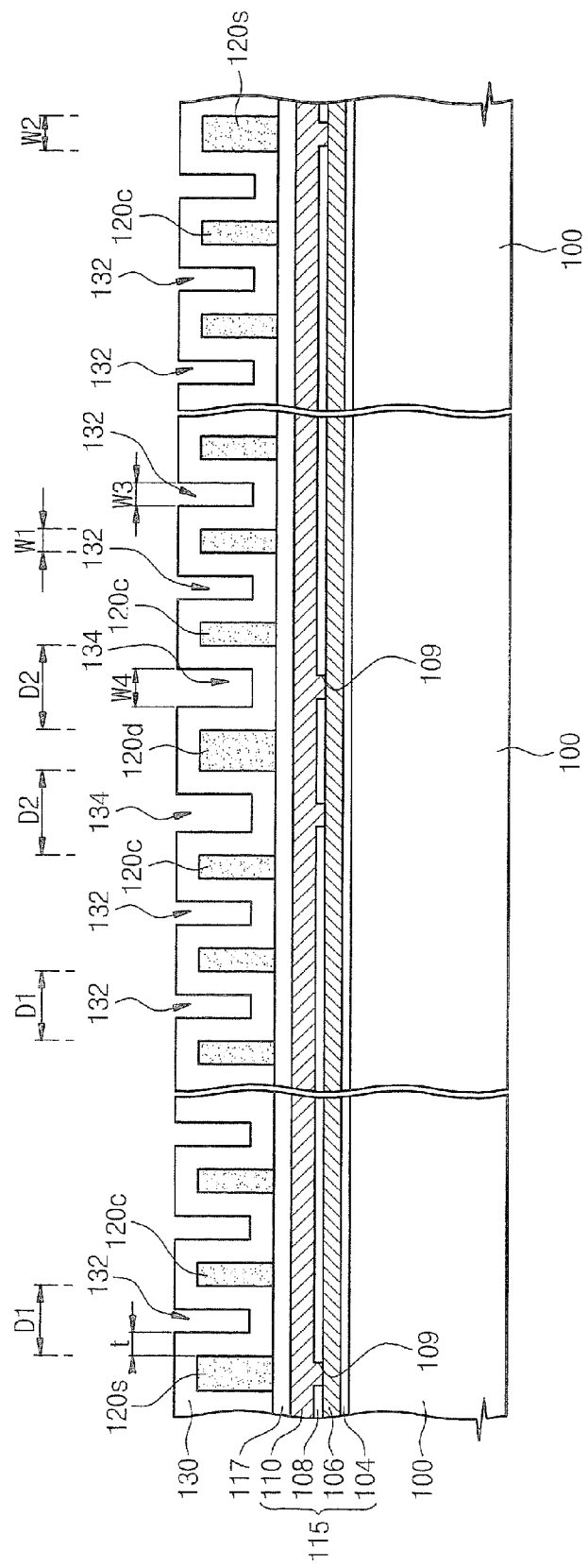

Referring to FIGS. 4A and 4B, a distance regulating layer 130 is conformally formed on the substrate 100 including the first mask patterns 120d, 120c, and 120s. The distance regulating layer 130 is made of a material having an etch selectivity with respect to the first mask patterns 120d, 120c, and 120s. The distance regulating layer 130 is formed to be conformal along top surfaces and sidewalls of the first mask patterns 120d, 120c, and 120s as well as top surfaces of capping insulating layers 117 between the first mask patterns 120d, 120c, and 120s. Thus, the distance regulating layer 130 includes grooves 132 and 134 between the first mask patterns 120d, 120c, and 120s. That is, the grooves 132 and 134 are surrounded by the distance regulating layer 130 between the first mask patterns 120d, 120c, and 120s. The grooves 132 and 134 extend in a parallel direction to the first mask patterns 120d, 120c, and 120s. First grooves 132 are arranged between a pair of adjacent first mask lines 120c and between a string select mask line 120s and an adjacent first cell mask line 120c, respectively. A second groove 134 is disposed between the source mask line 120d and an adjacent first cell mask line 120.

The first groove 132 has a third width W3, and the second groove 134 has a fourth width W4. The fourth width W4 of the second groove 314 is larger than the third width W3 of the first groove 132. The third width W3 of the first groove 132 can be equal to the first width W1 of the first cell mask line 120c, and the fourth width W4 of the second groove 134 can be equal to the second width W2 of the string select mask line 120s. The thickness t of the distance regulating layer 130 can be equal to the first width W1 of the first cell mask line 120c. However, the thickness t1 of the distance regulating layer 130 may be different from the first width W1 of the first cell mask line 120c.

Figure 5A:
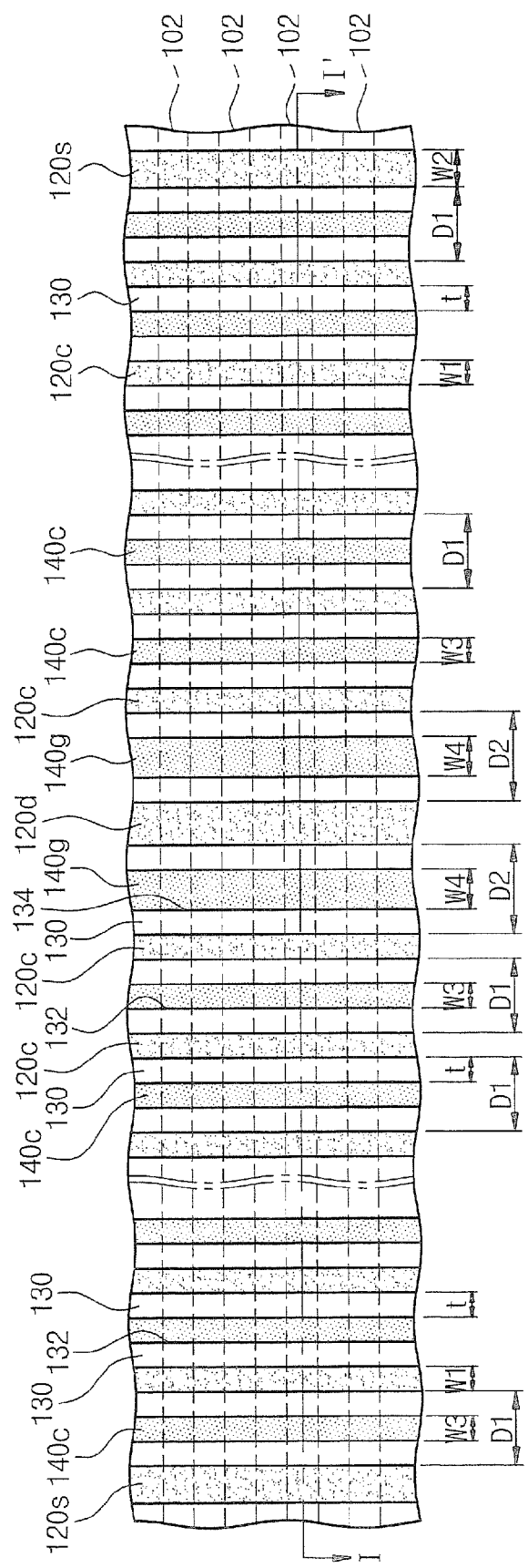
Figure 5B:
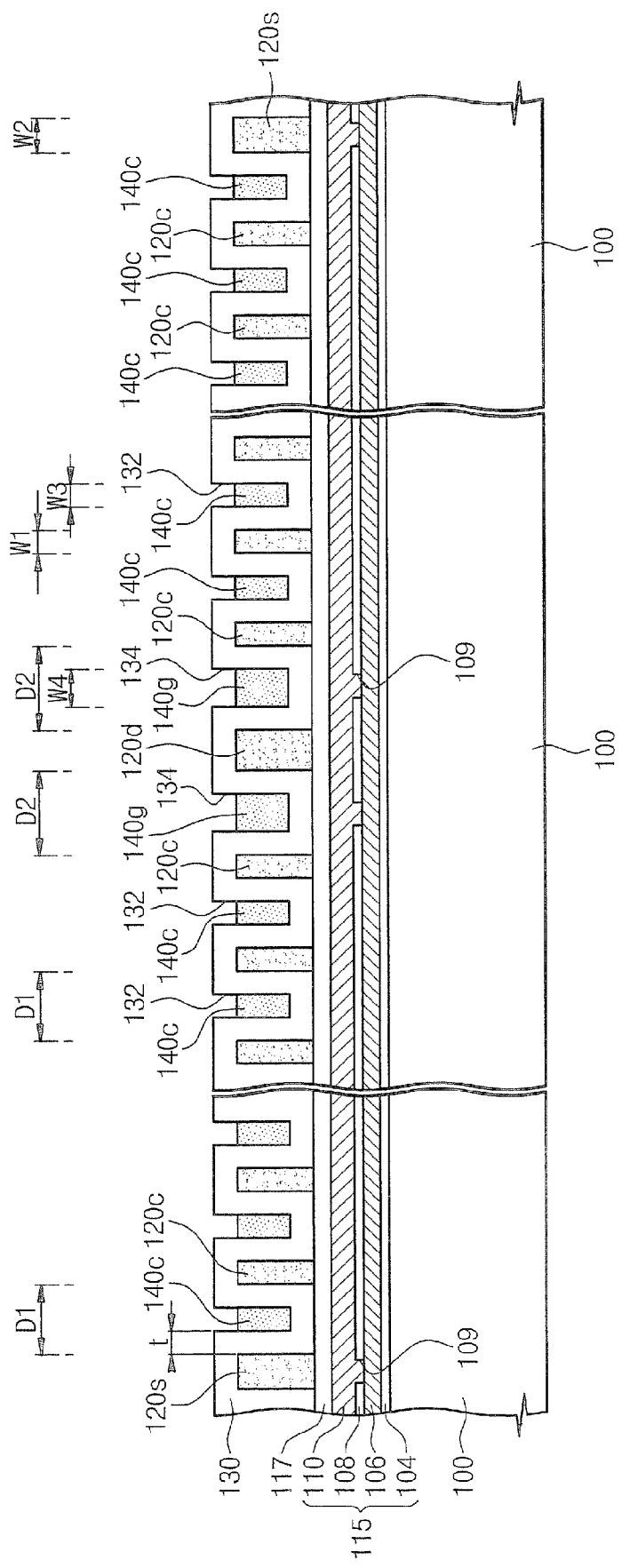

Referring to FIGS. 5A and 5B, a second mask layer is formed on the entire surface of the substrate 100 to fill the grooves 132 and 134. The second mask layer is etched to form second mask patterns in each of the grooves 132 and 134. The etching of the second mask layer may be carried out as an isotropic etching. Alternatively, the second mask layer may be anisotropically etched to form the second mask patterns.

The second mask patterns include a plurality of second mask lines 140c, each within a respective one of the first grooves 132, and a ground select line 140g within the second groove 134. The first mask patterns 120d, 120c, and 120s and the second mask patterns 140g and 140c are alternately arranged. In other words, the ground select mask line 140g is disposed between the source mask line 120d and a first cell mask line 120c adjacent to the source mask line 120d, and the first cell mask lines 120c and the second cell mask lines 140c are alternately repetitively arranged. The second cell mask line 140c is disposed between the string select mask line 120s and a first cell mask line 120c adjacent to the string select mask line 120s.

Due to the first groove 132, a linewidth of the second cell mask line 140c is equal to a third width W3 of the first groove 132. Further, due to the second groove 134, a linewidth of the ground select mask line 140 is equal to a fourth width W4 of the second groove 134. Thus, the ground select mask line 140g may have the same width as the string select mask line 120s and the second cell mask line 140c may have the same width as the first cell mask line 120c.

The distance regulating layer 130 also has an etch selectivity with respect to the second mask patterns 140g and 140c. For example, the first and second mask patterns 120d, 120c, 120s, 140g, and 140c may be formed of polysilicon and the distance regulating layer 130 may be made of oxide.

Because of the distance regulating layer 130, the first mask patterns 120d, 120c, 120s and the second mask patterns 140g and 140c, which are alternately disposed, may be arranged at regular defined distances. For example, the first and second mask patterns 120d, 120c, 120s, 140g, and 140c can be arranged to be spaced apart from adjacent other mask patterns at regular distances defined by the thickness "t" of the distance regulating layer 130.

Further, odd number of first and second mask patterns 140g, 120c, and 140c are formed between the source mask line 120d and the string select mask line 120s. Since a second mask pattern closest adjacent to the source mask line 120d is the ground select mask line 140g, an even number of first and second cell mask lines 120c and 140c are disposed between the source mask line 120d and the string select mask line 120s. As a result, the number of the sum of the first and second cell mask lines 120c and 140c may be 2n (n being a positive integer equal to or greater than 3).

Figure 6A:
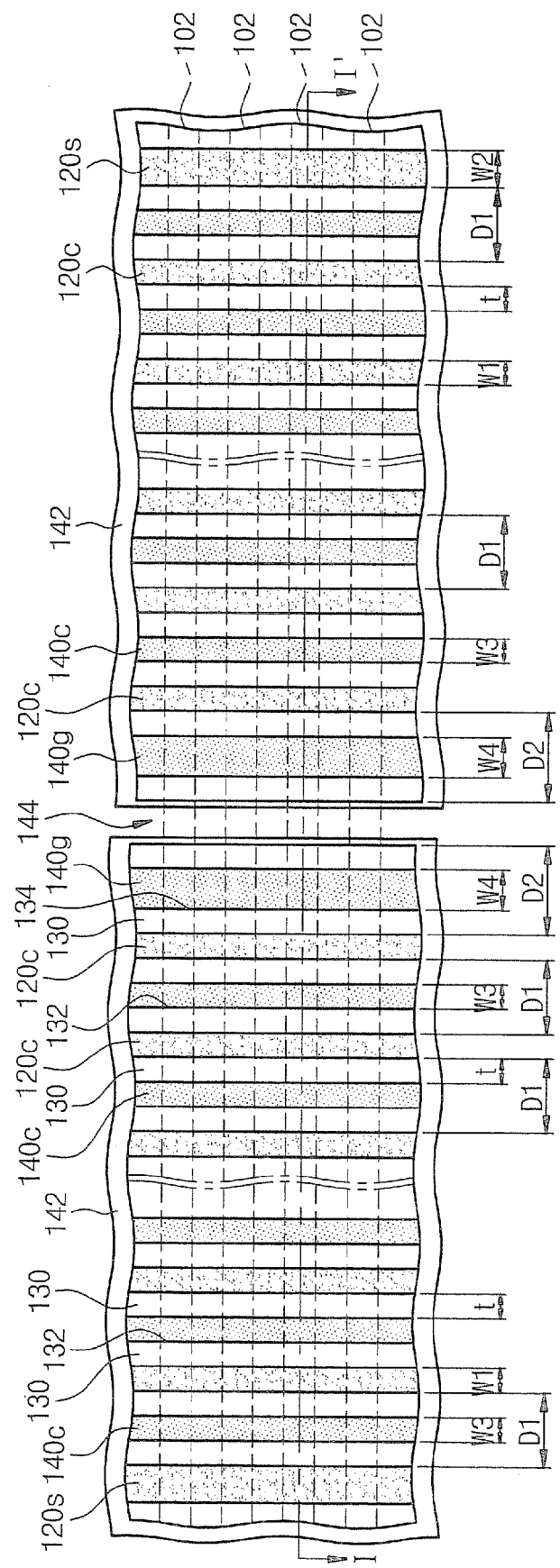
Figure 6B:
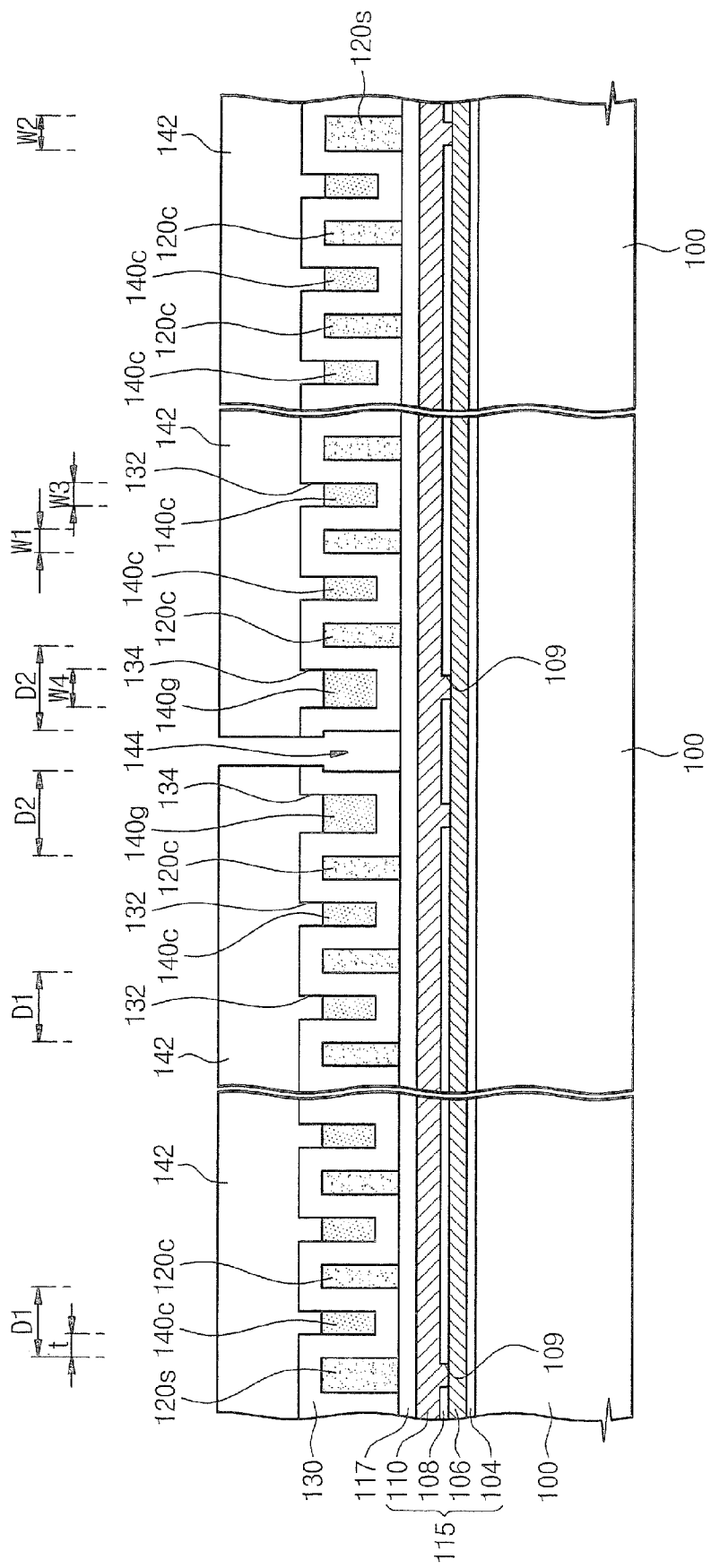

Referring to FIGS. 6A and 6B, a photoresist pattern 142 with an opening 144 is formed on the entire surface of the substrate 100. The opening 144 is provided to expose the distance regulating layer 130 formed on the source mask line 120d. The distance regulating layer 130 is etched using the photoresist pattern 142 as a mask to expose the source mask line 120d. The exposed source mask line 120d is removed. The removal of the exposed source mask line 120d may be carried out using an isotropic etch.

Figure 7A:
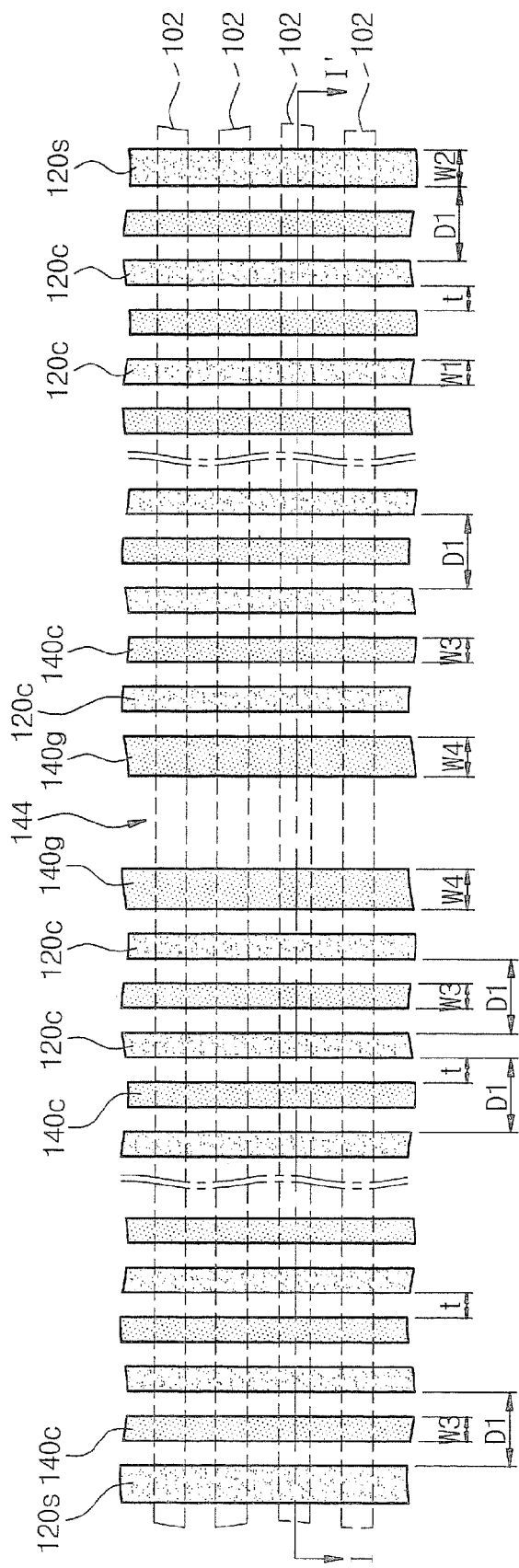
Figure 7B:
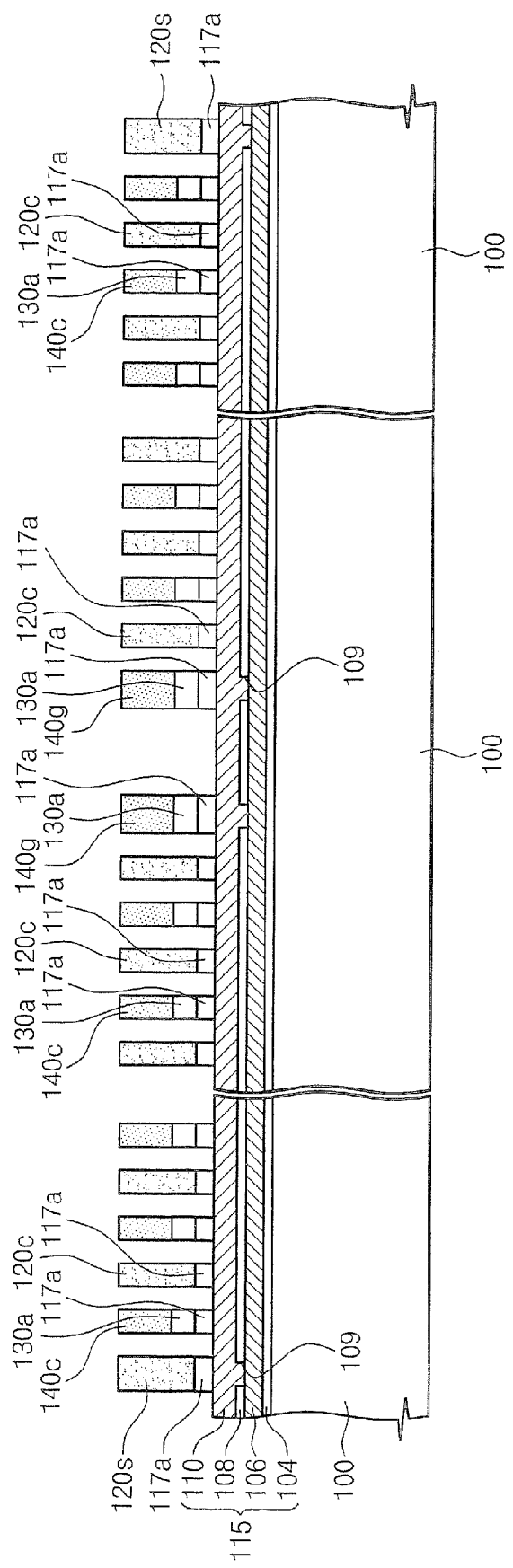

Referring to FIGS. 7A and 7B, the photoresist pattern 142 is removed and the distance regulating layer 130 and the capping insulating layer 117 at both sides adjacent to the first and second mask patterns 140g, 120c, 140c, and 120s are successively etched isotropically to expose the etching target layer 115. Thus, empty regions, i.e., spaces are formed between the first and second mask patterns 140g, 120c, 140c, and 120s. Because of the distance regulating layer 130, the spaces formed on both sides of the first and second cell mask lines 120c and 140c can have the same width. For example, the spaces on both sides of the ground select mask line and a first cell mask line 120c closest to the ground select mask line 140g can have the same width. Similarly, spaces on both sides of a second cell mask line 120c closest to the string select mask line 120s can have the same width.

A capping insulating pattern 117a, which is a remaining portion of the capping insulating layer 117, remains below the first cell mask lines 120c and below the string select mask line 120s. The capping insulating pattern 117a and residual patterns 130a, which are portions of the distance regulating layer 130, exist below the second cell mask lines 140c and the ground select mask line 140g, respectively.

Figure 8A:
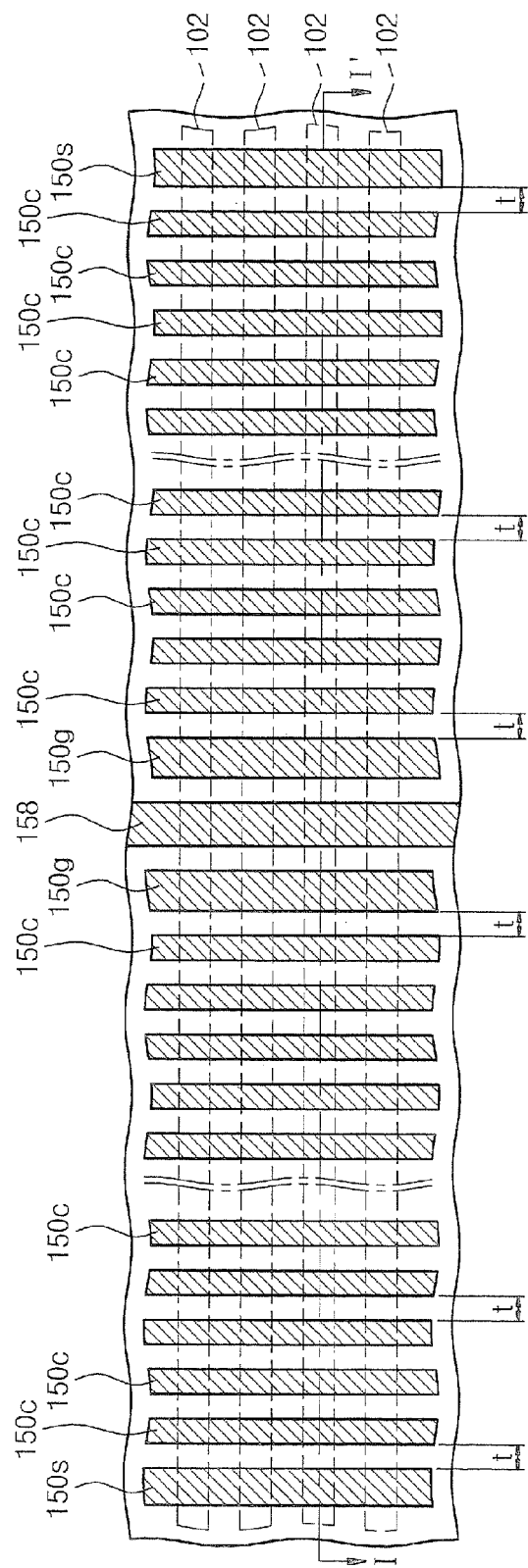
Figure 8B:
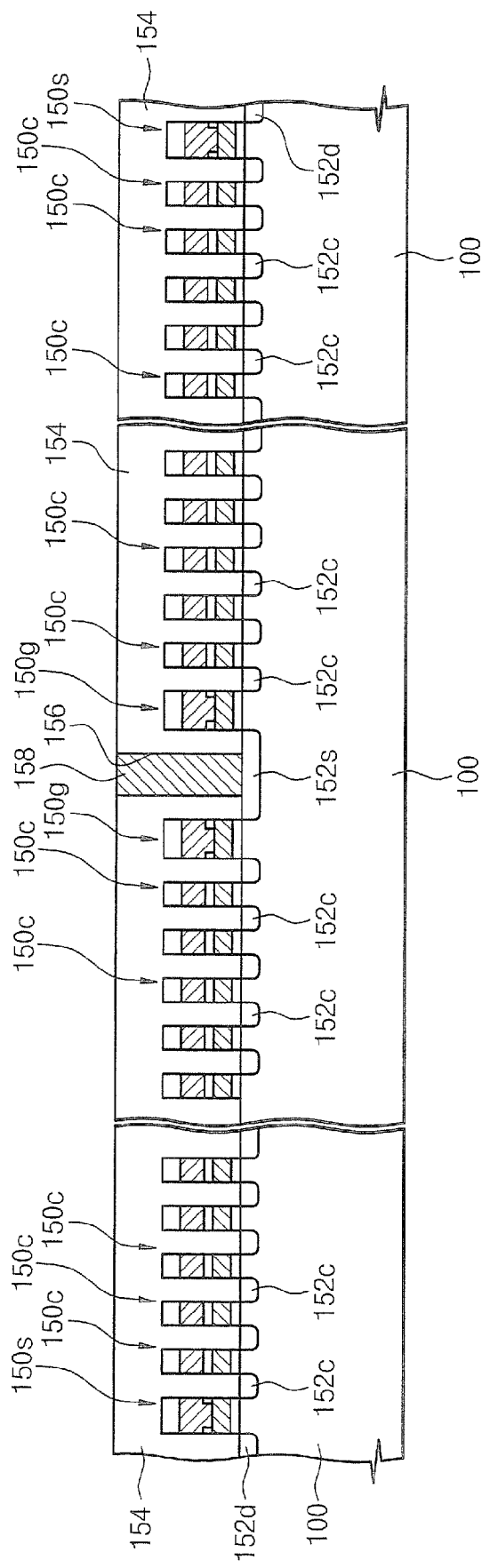
Figure 9A:
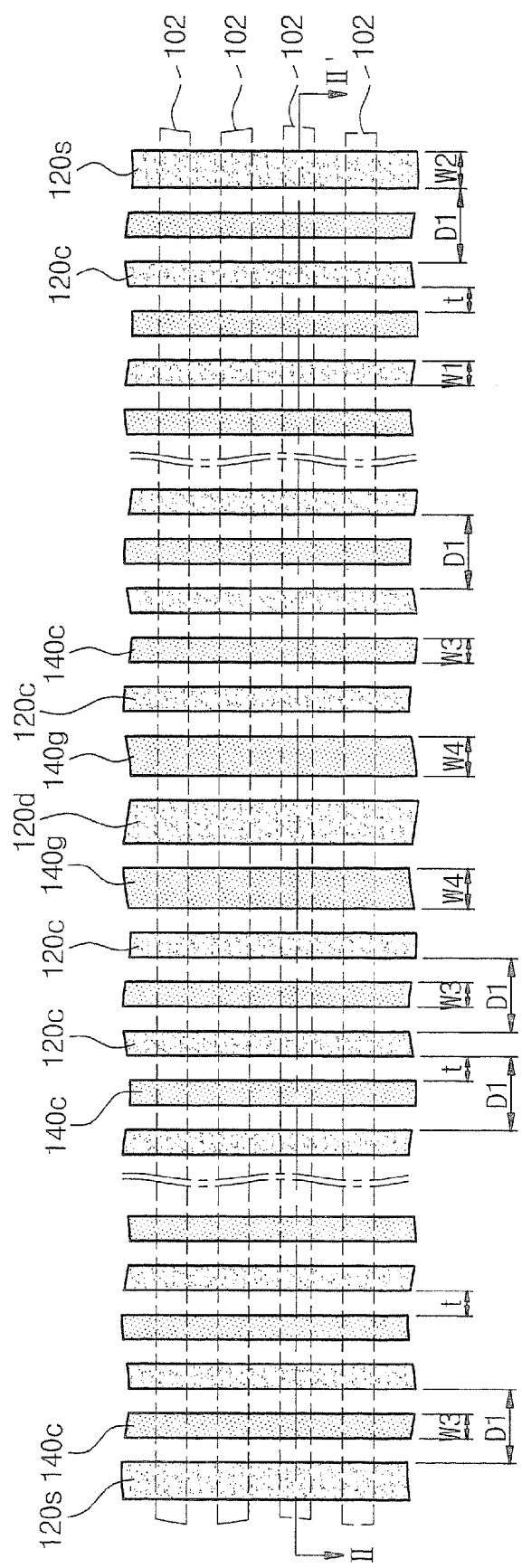

Referring to FIGS. 8A and 8B, the etching target layer 115 is patterned using the ground select mask line 140g, the first and second cell mask lines 120c and 140c, and the string select mask line 120s as etch masks to form a ground select gate line 150g, cell gate lines 150c, and a string select gate line 150s. The ground select gate line 150g is formed from the structure below the ground select mask line 140g. The cell gate lines 150c are formed from the structures below the first and second cell mask lines 120c and 140c. The string select gate line 150s is formed from the structure below the string select mask line 120s.

The cell gate lines 150c each include a tunnel insulator, a charge storage pattern, a blocking insulating pattern, and a control gate electrode which are stacked in the order listed. The cell gate lines 150c may each further include the capping insulating pattern 117a disposed on the control gate electrode. The charge storage pattern may be formed of polysilicon or an insulating material having deep-level traps. The ground select gate line 150g includes a gate insulator and a ground select gate electrode which are stacked in order the listed. The ground select gate line 150g may further include a capping insulating pattern 117a disposed on the ground select gate electrode. The ground select gate electrode includes a portion of the control gate conductive layer 110. The ground select gate electrode may further include a portion of the charge storage layer 106. In this case, a portion of the control gate electrode 110 and a portion of the charge storage layer 106 within the ground select gate electrode are connected to each other through the opening 109. The string select gate line 150s includes a gate insulator and a string select gate electrode which are stacked in the order listed. The string select gate line 150s may further include the capping insulating pattern 177a disposed on the string select gate electrode. The string select gate electrode includes another portion of the control gate conductive layer 110. The string select gate electrode may further include another portion of the charge storage layer 106. In this case, another portion of the charge storage layer 106 and another portion of the control gate conductive layer 110 within the string select gate electrode are connected to each other through the opening 109.

The first and second mask patterns 120c, 120g, 140g, and 140c are removed, and the residual patterns 130a below the second mask patterns 140g and 140c are removed. When the residual patterns 130a are removed, the capping insulating patterns 117a may also be removed. Alternatively, the capping insulating patterns 117a may remain, as illustrated.

Dopant ions are injected into the active region 102 using the gate lines 150g, 150c, and 150s as masks to form a common source region 152s, a cell source/drain region 152c, and a common drain region 152d. The common source region 152s is formed in an active region 102 adjacent to one side of the ground select gate line 150g. The cell source/drain region 152 is formed in the active region 102 adjacent to both sides of the cell gate line 150c. The common drain region 152d is formed in the active region 102 adjacent to one side of the string select gate line 150s. The ground select gate line 150g, the cell gate lines 150c, the cell source/drain regions 152c, and the string select gate line 150s are formed between the common source region 152s and the common drain region 152d.

An interlayer dielectric 154 is formed to cover the entire surface of the substrate 100. The interlayer dielectric 154 is patterned to form a source groove 156 to expose the common source region 152s. The source groove 156 extends in parallel with the gate lines 150g, 150c, and 150s. A source line 158 is formed in, and may fill, the source groove 156. The source line 158 is formed from a conductive material.

According to the above-described exemplary methods, the source mask line 120d, the first cell mask lines 120c, and the string select mask line 120s included in the first mask patterns are spaced apart from each other at relatively large distances. Consequently, an exposure process for the first mask patterns 120d, 120c, and 120s may be carried out more easily. Grooves 132 and 134 are formed from the distance regulating layer 130. Second mask patterns 140g and 140c are formed in the grooves 132 and 134. Consequently, the second mask patterns 140g and 140c are self-aligned between the first mask patterns 120d, 120c, and 120s. Due to the thickness "t" of the space regulating layer 130, the first and second mask patterns 120d, 120c, 120s, 140g, and 140c are disposed at regular distances. As a result, each of all cell gate lines 150c disposed between the ground select gate line 150g and the string select gate line 150s may have the same width of spaces formed at its both sides. For this reason, the characteristic dispersion occurring in cell transistors including the cell gate lines 150c may be reduced.

In addition, the first mask patterns include a source mask line 120d disposed at a region where a common source region will be formed in a subsequent process. Accordingly, an even combined number of the ground select mask line 140g and the first and second cell mask lines 120c and 140c are disposed between the source mask line 120d and the string select mask line 120s. As a result, the combined number of the first and second cell mask lines 120c and 140c may be 2n (n being a positive integer equal to or greater than 3).

Figure 13:
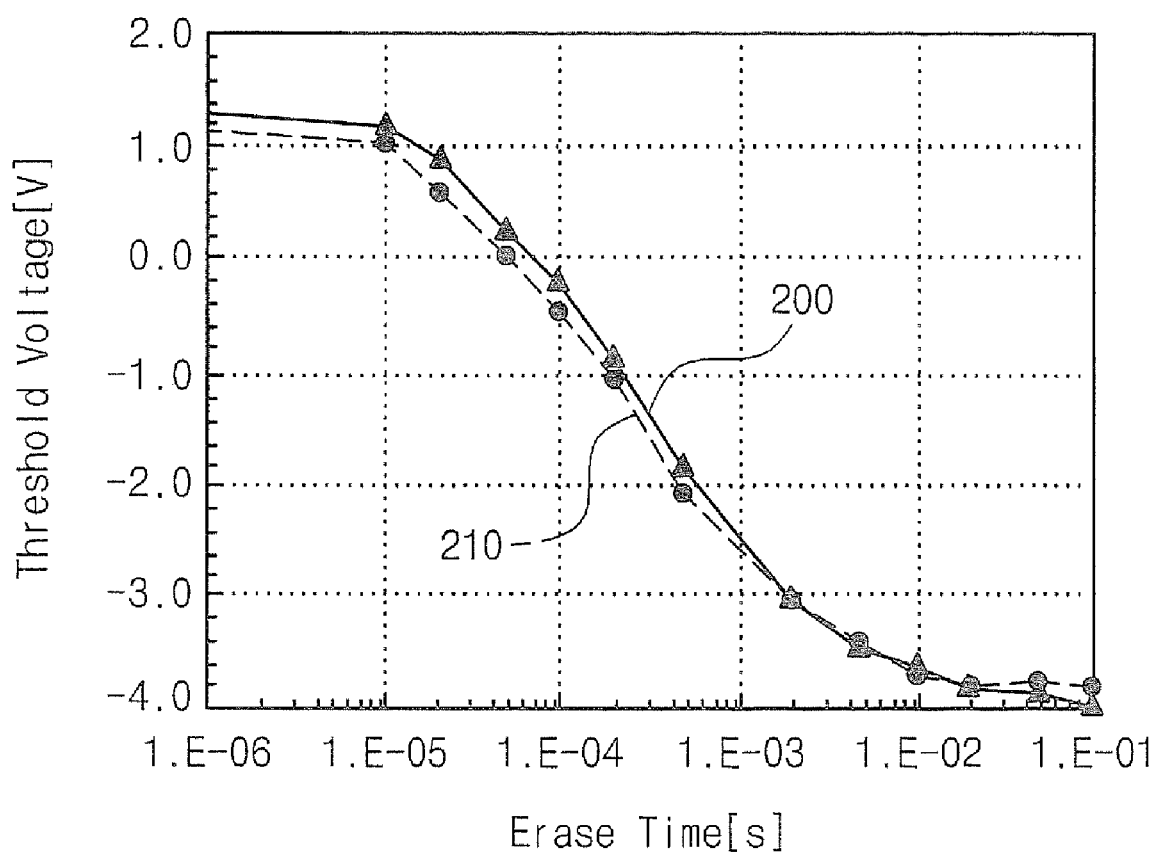
FIG. 13 is a graph illustrating exemplary characteristics of cells in a non-volatile memory device according to some embodiments of the present invention.

FIG. 13 is a graph illustrating exemplary test data for the characteristic dispersion of cell transistors of a non-volatile memory device that may be formed using the above-described methods. In the exemplary non-volatile memory device used in the test, 32 cell gate lines 150c were formed at regular distances between a ground select gate line 150g and a string select gate line 150s. The characteristic dispersion of cells in a non-volatile memory device will now be described below with reference to FIG. 13. In the graph of FIG. 13, x-axis and y-axis denote erase time and threshold voltage, respectively.

Referring to FIGS. 8A, 8B, and 13, a solid line 200 denotes a threshold voltage of a cell transistor including a 13th cell gate line 150c from a ground select gate line 150g, and a dotted line 210 denotes a threshold voltage of a cell transistor including a 32nd cell gate line 150c from the ground select gate line 150g. That is, the dotted line 210 denotes a threshold voltage of a cell transistor including a cell gate line 150c closest to a string select gate line 150s.

As illustrated, threshold voltage fluctuation depending on the erase time of the dotted line 210 is nearly identical to that of the solid line 200. This shows the fact that among 32 cell transistors, an erase threshold voltage and erase time of a cell transistor adjacent to the string select gate line 150s are nearly identical to those of a centrally disposed cell transistor. As a result, it may be understood that the characteristic dispersion of a cell transistor adjacent to the ground select gate line 150g and/or the string select gate line 150s was reduced.

Other exemplary methods of forming a non-volatile memory device will now be described which are similar to the above-described methods. These new exemplary methods may include the methods described above with reference to FIGS. 3A through 5A and FIGS. 3B through 5B.

FIGS. 9A through 12A are top plan views illustrating the other methods of forming a non-volatile memory device according to some other embodiments of the present invention FIGS. 9B through 12B are cross-sectional views taken along lines II-II' of FIGS. 9A through 12A, respectively.

Referring to FIGS. 5A, 5B, 9A, and 9B, after forming a ground select mask line 140g and second cell mask lines 140c, distance regulating layers at both sides of source mask, ground select, first cell, second cell, and string select mask lines 120d, 140g, 120c, 140c, and 120s and a capping insulating layer 117 are successively etched anisotropically to expose an etching target layer 115. Thus, spaces are formed at both sides of the first and second mask patterns 120d, 120s, 140g, and 140c. A residual pattern 117a, which is a portion of the capping insulating layer 117, remains below the source mask line 120d.

Figure 10A:
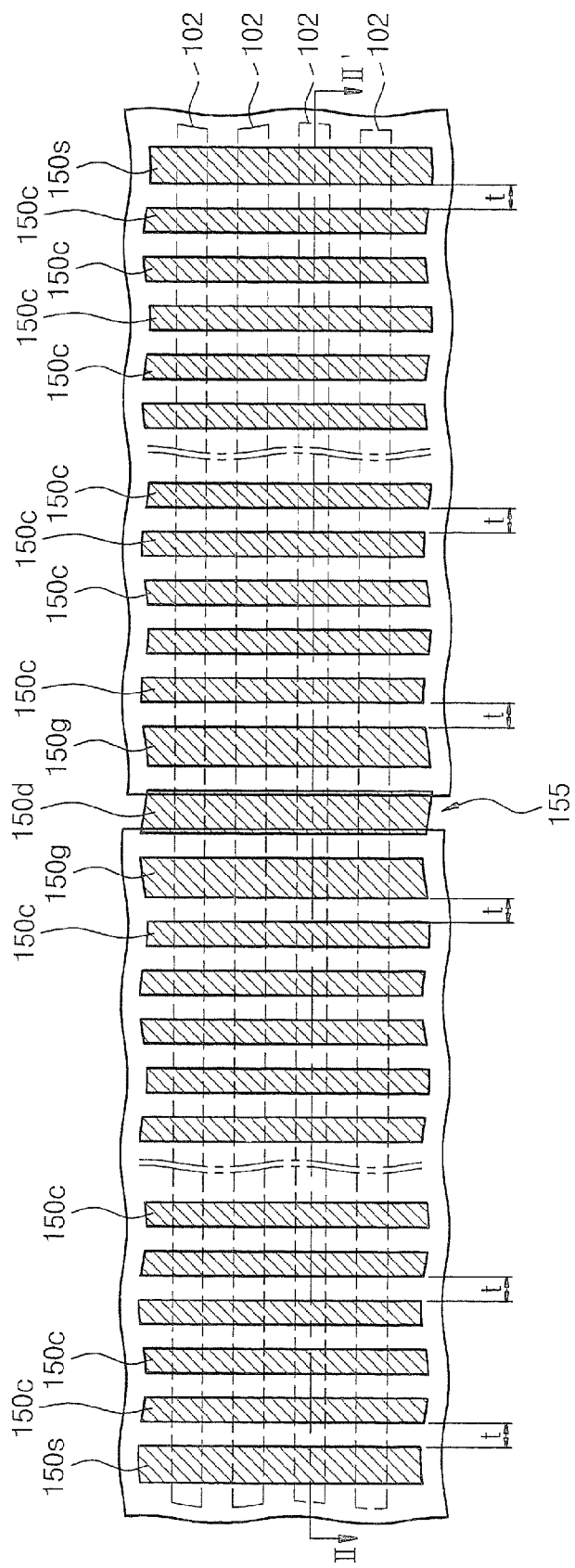
Figure 10B:
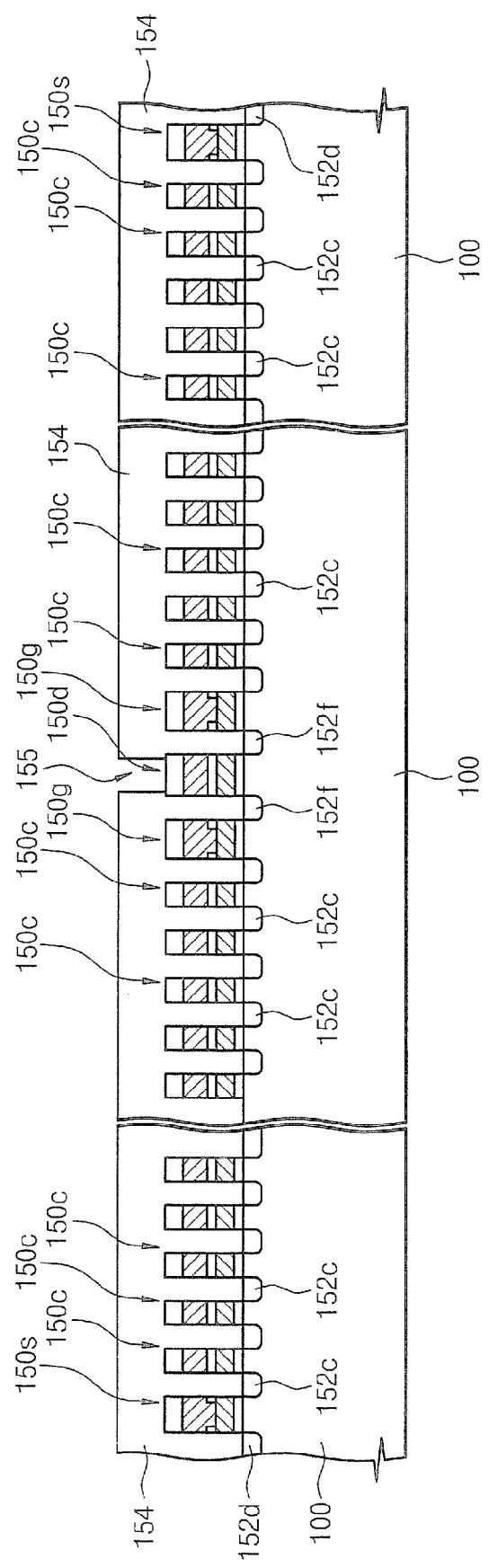

Referring to FIGS. 10A and 10B, the etching target layer 115 is patterned using the source mask, ground select, first cell, second cell, and string select mask lines 120d, 140g, 140c, and 120s as etch masks to form a dummy source line 150d, a ground select gate line 150g, a plurality of cell gate lines 150c, and a string select gate line 150s. The dummy source line 150d may be formed of the same stacked materials as the cell gate line 150c.

The source mask, ground select, first cell, second cell, and string select mask lines 120d, 140g, 120c, 140c, and 120s are removed. Residual patterns 130a disposed below the ground select and second cell mask lines 140g and 140c are removed.

When the residual patterns 130a are removed, capping insulating patterns 117a included in the gate lines 150g, 150c, and 150s and the dummy source line 150d may be removed. Alternatively, the capping insulating patterns 117a included in the gate lines 150g, 150c, and 150s and the dummy source line 150d may remain.

First dopant ions are injected into an active region 102 using the dummy source line 150d and the gate lines 150g, 150c, and 150s as masks to form a first dopant doping region 152f, a cell source/drain region 152c, and a common drain region 152d. The first dopant doping region 152f is formed at the active region 102 between the dummy source line 150d and the ground select gate line 150g.

An interlayer dielectric 154 is formed on the entire surface of a substrate 100. The interlayer dielectric 154 is patterned to form a preliminary source groove 155 to expose the dummy source line 150d.

Figure 11A:
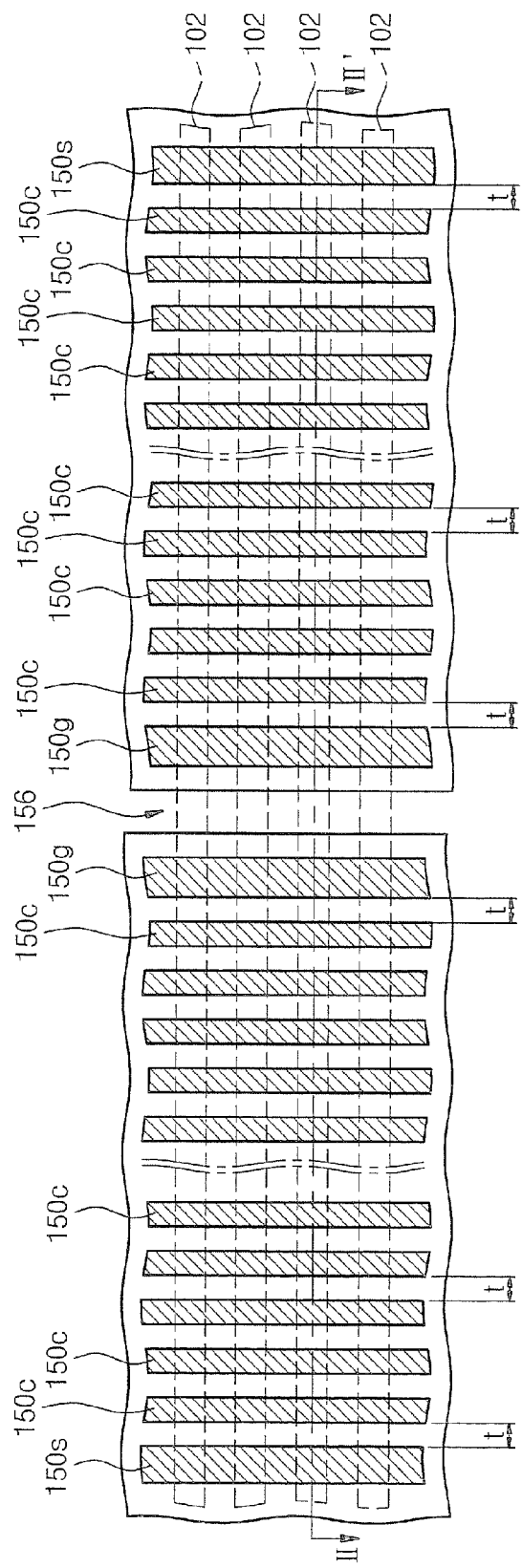
Figure 11B:
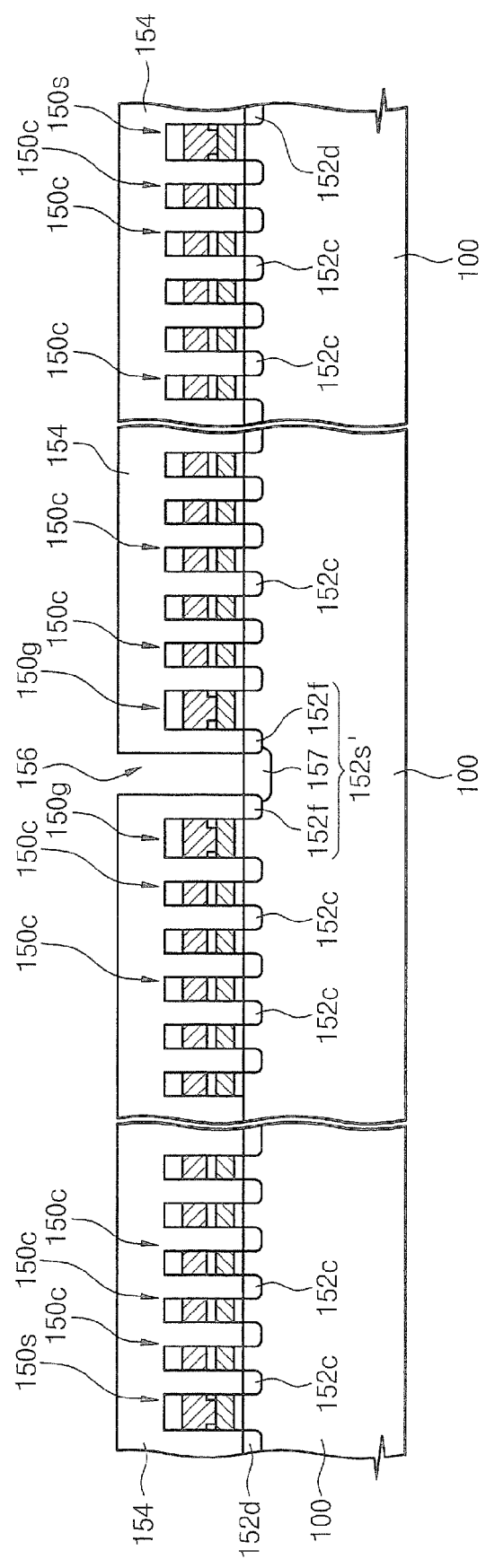

Referring to FIGS. 11A and 11B, the exposed dummy source line 150d is removed to form a source groove 156. Second dopant ions are injected into an active region 102 below the source groove 156 through the source groove 156 to form a second dopant doping region 157. Since the first and second dopant ions have the same type, they are connected to each other in a side direction. The first and second dopant doping regions 152f and 157 constitute a common source region 152s'.

Figure 12A:
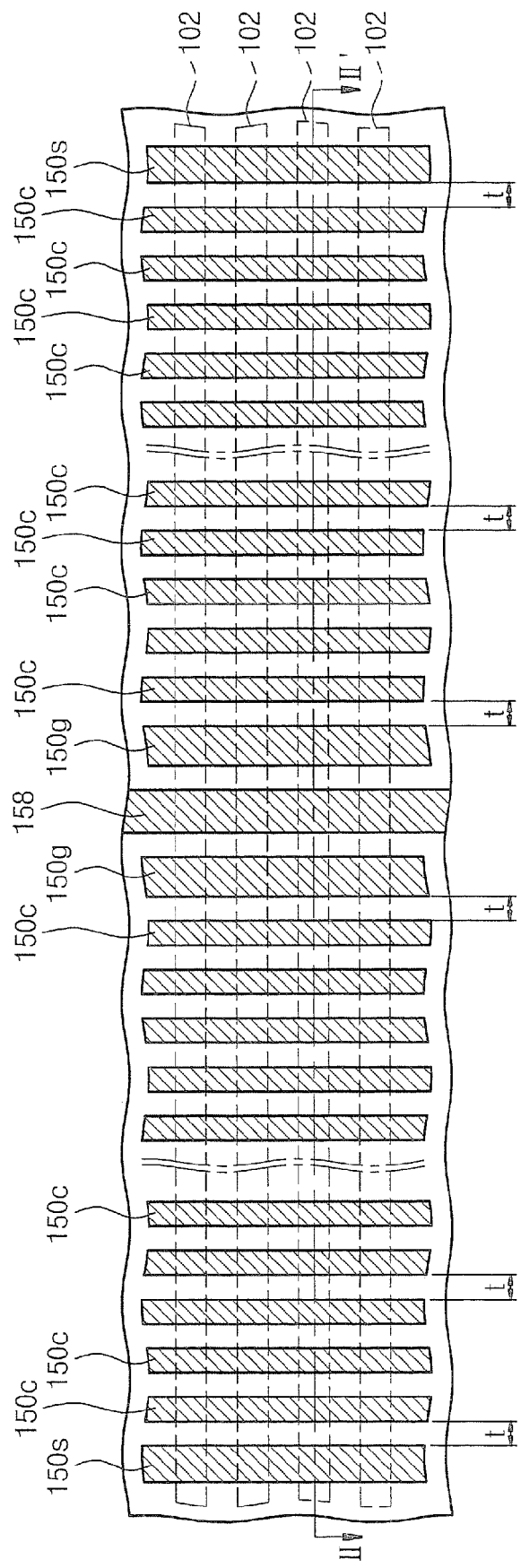
Figure 12B:
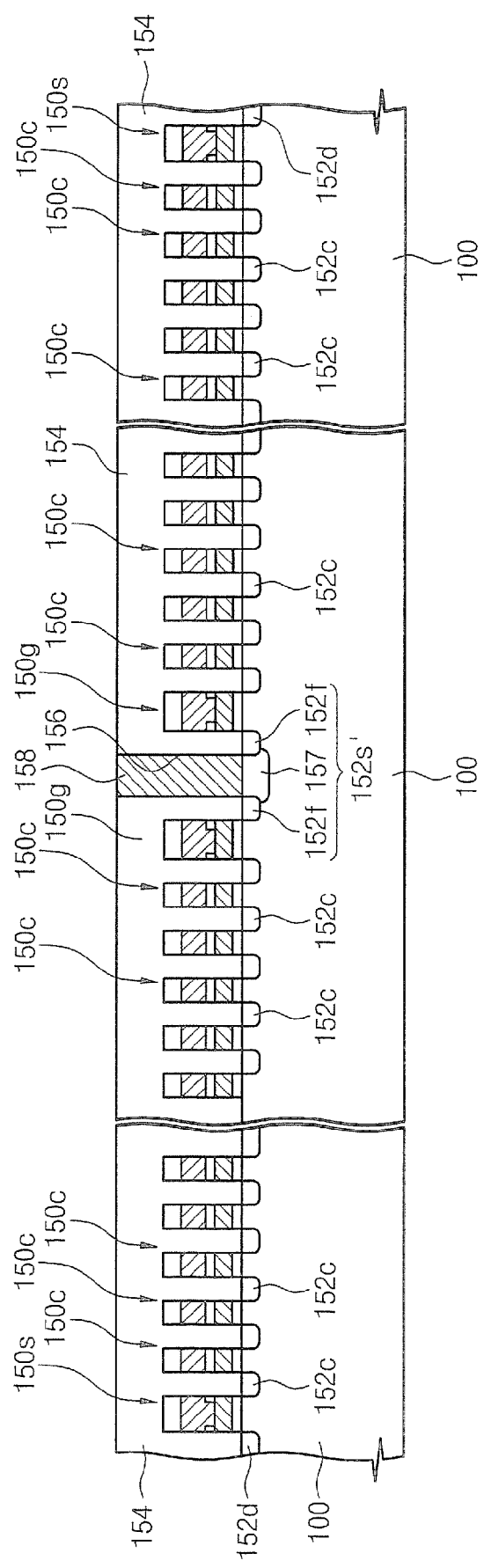

Referring to FIGS. 12A and 12B, a source line 158 is formed to fill the source groove 156. The source line 158 is connected to the common source region 152s'.

According to the foregoing methods, there is no need for an exposure process to remove the source mask line 120d. Moreover, since the dummy source line 150d formed by the source mask line 120d is removed using a photo mask for removing the source groove 156, an additional process associated with the source mask line 120d is not required. As a result, the fabricating cost for a non-volatile memory device is reduced to enhance production yield.

As described, after forming first mask patterns having large distances therebetween, a distance regulating layer is conformally formed thereon and second mask patterns are formed to fill grooves defined by the first mask patterns. Therefore, it is possible to increase the margin available during an exposure process for forming the first mask patterns and to form a ground select gate line, cell gate lines, and string select gate lines at regular distances. As a result, characteristic dispersion of a cell transistor adjacent to a string select and/or ground select gate lines can be reduced.

Moreover, the first mask patterns include a source mask line, a string select mask line, and a plurality of first cell mask lines disposed between the source mask line and the string select mask line. Accordingly, an even combined number of one ground select mask line and first and second cell mask lines are disposed between the source mask line and the string select mask line. As a result, the combined number of the first and second cell mask lines may be 2n (n being a positive integer equal to or greater than 3).

Although the present invention has been described in connection with various embodiments of the present invention illustrated in the accompanying drawings, it is not limited thereto. It will be apparent to those skilled in the art that various substitutions, modifications and changes may be made without departing from the scope and spirit of the invention.

What is claimed is:

1. A method of forming a non-volatile memory device, the method comprising:

forming first mask patterns on an etching target layer that is on a substrate, the first mask patterns including a source mask line, a string select mask line, and a plurality of first cell mask lines disposed between the source mask line and the string select mask line;

forming a distance regulating layer that conformally covers the first mask patterns and defines grooves thereon that are between and extend parallel to adjacent pairs of the first mask patterns;

forming second mask patterns in the grooves between the first mask patterns, the second mask patterns including a ground select mask line in a groove adjacent to the source mask line and a plurality of second cell mask lines each in one of another grooves adjacent to the first cell mask lines;

anisotropically etching the distance regulating layer on both sides of the ground select mask line, the string select mask line, the first cell mask lines, and the second cell mask lines to expose portions of the etching target layer; and patterning the etching target layer using the ground select mask line, the string select mask line, the first cell mask lines, and the second cell mask lines as etch masks to form a ground select gate line, a string select gate line, and a plurality of cell gate lines, respectively.

2. The method as recited in claim 1, further comprising before patterning the etching target layer:

removing the source mask line, wherein the etching target layer at the location of the removed source mask line is removed during the patterning process.

3. The method as recited in claim 2, further comprising after patterning the etching target layer to form the ground select gate line, the string select gate line, and the plurality of cell gate lines:

injecting dopant ions into the substrate using the ground select gate line, the plurality of cell gate lines, and the string select gate line as masks to form a common source region, cell source/drain regions, and a common drain region, respectively, in the substrate;

forming an interlayer dielectric that covers the entire surface of the substrate;

patterning the interlayer dielectric to form a source groove that exposes the common source region of the substrate; and forming a source line in the source groove.

4. The method as recited in claim 3, further comprising:
removing the first and second mask patterns.

5. The method as recited in claim 1, wherein the patterning the etching target layer comprises:

patterning the etching target layer using the source mask line, the ground select mask line, the first and second cell mask lines, and the string select mask line as etch masks to form a dummy source line, the ground select gate line, the plurality of cell gate lines, and the string select gate line, respectively.

6. The method as recited in claim 5, further comprising after forming the dummy source line, the ground select gate line, the plurality of cell gate lines, and the string select gate line:

injecting first dopant ions into the substrate using the dummy source line, the ground select gate line, the plurality of cell gate lines, and the string select gate line as masks to form a first doping region, a common source region, cell source/drain regions, and a common drain region, respectively;

forming an interlayer dielectric on the entire surface of the substrate;

patterning the interlayer dielectric to form a preliminary source groove that exposes the dummy source line;

removing the exposed dummy source line to form a source groove;

injecting second dopant ions into the substrate through the source groove to form a second doping region; and forming a source line in the source groove on the second doping region of the substrate, wherein the first doping region is formed in a region of the substrate between the dummy source line and the ground select gate line, and the first and second doping regions are connected to each other to form a common source region.

7. The method as recited in claim 6, further comprising:
removing the first and second mask patterns.

8. The method as recited in claim 1, wherein the combined number of the first cell mask lines and the second cell mask lines is 2n, with n being a positive integer equal to or greater than 3.

9. The method as recited in claim 1, wherein the groove between a pair of adjacent first cell mask lines has the same width as the first cell mask line.

10. The method as recited in claim 9, wherein the thickness of the distance regulating layer is equal to the width of the first cell mask line.

11. The method as recited in claim 1, wherein:
the grooves include first grooves and a second groove;
the first grooves are disposed between a pair of adjacent first cell mask lines and between the string select mask line and the first cell mask line adjacent to the string select mask line;
the second groove is disposed between the source mask line and the first cell mask line adjacent to the source mask line; and
the second groove has a larger width than the first groove.

12. The method as recited in claim 11, wherein the width of the first groove is equal to a width of the first cell mask line.

13. The method as recited in claim 11, wherein the width of the second groove is equal to a width of the string select mask line.

14. The method as recited in claim 1, wherein the distance regulating layer is formed from a material having an etch selectivity with respect to the first and second mask patterns.

15. The method as recited in claim 1, wherein the cell gate lines each include a tunnel insulator, a charge storage pattern on the tunnel insulator, a blocking insulating pattern on the charge storage pattern, and a control gate electrode on the blocking insulating pattern.

* * * * *